(12) United States Patent
Andersen et al.

(10) Patent No.: US 7,170,732 B2
(45) Date of Patent: Jan. 30, 2007

(54) SURGE DELAY FOR CURRENT LIMITER

(75) Inventors: David Andersen, Ames, IA (US); Thruston Awalt, Los Gatos, CA (US)

(73) Assignee: Micrel Incorporated, San Jose, CA (US)

( * ) Notice: Subject to any disclaimer, the term of this patent is extended or adjusted under 35 U.S.C. 154(b) by 194 days.

(21) Appl. No.: 10/915,276

(22) Filed: Aug. 10, 2004

(65) Prior Publication Data

US 2006/0034030 A1    Feb. 16, 2006

(51) Int. Cl.
*H02H 3/00*    (2006.01)
(52) U.S. Cl. ........................................ 361/97
(58) Field of Classification Search ............... 361/97
See application file for complete search history.

(56) References Cited

U.S. PATENT DOCUMENTS

| | | | | |
|---|---|---|---|---|
| 3,633,073 A | * | 1/1972 | Day et al. .................. 361/22 |
| 4,057,842 A | * | 11/1977 | Bauman et al. ............. 361/93.5 |
| 4,279,013 A | | 7/1981 | Cameron et al. |
| 4,933,799 A | * | 6/1990 | Lai .......................... 261/25 |
| 5,170,311 A | * | 12/1992 | Zulaski et al. .............. 361/94 |
| 5,418,675 A | * | 5/1995 | Bodenheimer et al. ....... 361/20 |
| 5,794,022 A | * | 8/1998 | Karouji ..................... 713/601 |

* cited by examiner

*Primary Examiner*—Brian Sircus
*Assistant Examiner*—Ann Hoang
(74) *Attorney, Agent, or Firm*—Ladas & Parry LLP

(57) ABSTRACT

A surge current delay time period is added to a current limit delay time period in order to permit a longer time for a possibly temporary larger-than-steady-state electrical current, such as for a start-up power requirement. A system is described for permitting a legitimate surge current by distinguishing true over-current fault conditions from temporary surges in terms of high current duration time.

14 Claims, 4 Drawing Sheets

SURGE DELAY FOR CURRENT LIMITER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

The technology described herein is generally related to the field of power distribution and more particularly to delaying activation of a current limiter in order to allow temporary surge currents.

2. Description of Related Art

Electronic appliances often require protection against power surges which could result in faulty operation or damage. Particularly for sensitive electronics such as computers and portable telecommunications devices using semiconductor components, when electrical power is applied some mechanism for limiting the power—particularly the electrical current being drawn—is advantageous. Such mechanisms can both protect the instrument's power supply from being drained of all energy and against the possibility of a start-up fault, damage to the unit, or even a fire in the event of a severe load or electrical fault associated with the power supply. It is known in the art to use a variety of fault protection methods and devices such as fuses, resettable fuses and circuit breakers, polymeric positive temperature coefficient devices, current limiter circuitry, and the like.

However, not all legitimate loads behave in the same manner. Some loads such as incandescent lights and motors are known to draw a substantially larger electrical current upon start-up—commonly referred to as a "surge current"—than is required for steady-state operation. The known manner fault protection methods and devices may restrict or cut-off a current to the load prematurely during such a surge, causing the load to stall or to fail altogether. Certain load appliances like disk drives, charge-coupled device (CCD) cameras, scanners and the like may actually require large, extended transient electrical current during a start-up routine.

FIG. 1 (Prior Art) shows a typical CURRENT LIMITER 100 attached to a LOAD 101. Assume for this explanation that the LOAD 101 is an appliance connected to a power supply, VDD, using a metal oxide semiconductor field effect transistor (MOSFET) ON-OFF power distribution switch 103. A known manner CURRENT SENSE circuit 105 senses the current through the power distribution switch 103. The CURRENT SENSE circuit 105 provides a signal indicative of real-time current through the switch 103 to a CURRENT LIMIT AMPLIFIER 107. The current sense signal to the positive side input of the CURRENT LIMIT AMPLIFIER 107 is compared therein to a REFERENCE signal generator 109 output signal defining a predetermined threshold for recognizing an over-current condition at the switch 103. If an over-current state is detected, the CURRENT LIMIT AMPLIFIER 107 provides an output signal to a GATE DRIVE CIRCUIT 111. This results in a gate drive signal output to the power distribution switch 103 being decreased, increasing the power distribution switch ON-resistance, thereby limiting the current to the LOAD 101.

With the typical CURRENT LIMITER 100 there is a delay—also known in the art as the "current limit delay time"—between when the over-current state is detected and when the power distribution switch 103 begins limiting the current to the LOAD 101. The current limit delay time is dependent on the response time of the above-described current limiter circuitry control loop components. The current limit delay time, "CLDT," may be expressed as:

$$CLDT = CL_{RT},$$

where $CL_{RT}$ is the reaction time of the circuitry making up the CURRENT LIMITER 100. In typical applications, such delay times are in the range of about tens-to-hundreds of microseconds. However, for some load applications, start-up currents are needed that are actually larger than the desired current limit threshold defined by the REFERENCE 109 and have start-up times in the tens-to-hundreds of milliseconds range. The relatively faster current limit delay times of the typical CURRENT LIMITER 100 may not allow such applications to start correctly. To avoid this problem, some existing current limiters set their current limit thresholds high enough to allow a surge current without limiting. However, with the current limit threshold set that high, the current limiter may fail to detect a legitimate, steady state, over-current condition.

In other words, existing CURRENT LIMITERS 100 either act too fast or have a current limit threshold set so high that a legitimate over-current condition may not be detected.

The present invention addresses these and other related problems.

BRIEF SUMMARY

The present invention generally provides a method and apparatus for a surge delay for high side power distribution switch current limiting.

One aspect may be described as a system for controlling electrical current through a power distribution switch to a load having a predetermined start-up power demand and a predetermined steady-state power requirement, the system including: connected to said switch, a current limiter circuit having a current limit delay time; and connected to said current limiter, a surge delay circuit having a surge delay time having a predetermined relationship to said predetermined start-up power demand such that real-time electrical current through said switch in excess of said steady-state power requirement does not trigger said current limiter circuit until after a time approximately equal to a sum of said current limit delay time and said surge delay time. Another aspect may be described as a surge protection delay device for enabling a current limiter for a predetermined load, the device including: mechanisms for determining a load over-current condition; and driven by said mechanisms for determining, mechanisms for delaying activation of said current limiter by a time period approximately equal to a predetermined surge current characteristic of the load. Yet another aspect may be described as an electrical current surge protection system for a given load, the system including: a current limiter circuit having a current limit delay time; connected to said current limiter circuit, a surge delay circuit having a surge delay time, such that when said current limiter circuit detects a load over-current condition at said given load said surge delay circuit adds said surge delay time to said current limit delay time and delays enabling of said current limiter circuit. Still another aspect may be described as an electrical current surge protection system for a given load connected to a power source via a power distribution switch, said load having a predetermined start-up power demand characteristic higher than steady state operation power demand requirements, the system including: a primary current limiter circuit having a current sensing circuit sensing current through said switch and providing a signal indicative of real-time current therethrough, a reference signal generator providing a reference threshold level indicative of an over-current condition for said load, and a limiter stage, including a current limit amplifier for amplifying an error signal comprising the difference between said reference threshold level and said signal indicative of real-time current and for providing an output control signal to said switch for regulating the current through said switch at the current limit level for an over-current condition and turning said switch fully on when not in the over-current condition, and wherein said limiter stage has a first current limit delay time characteristic; and a surge delay stage having a second current limit delay time characteristic having a predetermined relationship to said predetermined start-up power demand characteristic such that a said real-time current through said switch in excess of said threshold level does not trigger said current limiter until after a time approximately equal to the sum of said first current limit delay time characteristic and said second current limit delay time characteristic.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01 (d) merely to apprise the public, and more especially those interested in the particular art to which the invention relates, of the nature of the invention in order to be of assistance in aiding ready understanding of the patent in future searches.

BRIEF DESCRIPTION OF THE DRAWINGS

The drawings in this specification should be understood as not being drawn to scale unless specifically annotated as such.

Like reference designations represent like features throughout the drawings.

DETAILED DESCRIPTION

Figure 2:
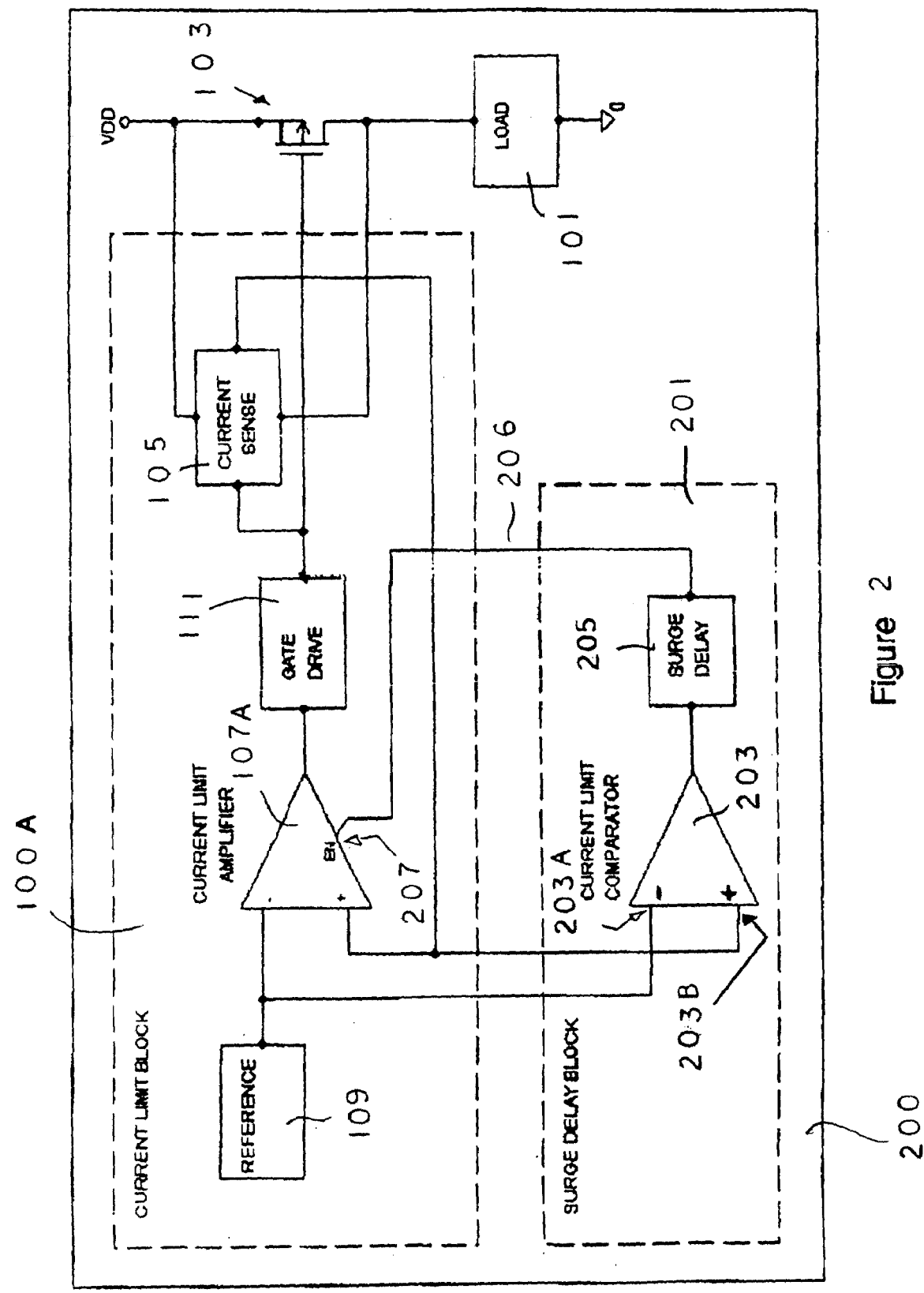
FIG. 2 is a schematic block diagram for an exemplary embodiment of the present invention.

In a basic aspect, the present invention adds a predetermined delay time—referred to hereinafter as the "surge delay time" or "SDT"—in which the SDT is a period between the time when an over-current state is detected by current limit circuitry for a power distribution switch and the time when the current limit circuitry is enabled. In other words, an SDT period is added to the current limiter circuitry delay time period—described in the Background section hereinabove—in order to permit a longer time for a temporary surge current, such as a start-up power requirement, needed by a given load. FIG. 2 is a schematic block diagram for an exemplary embodiment of a system 200 in accordance with this basic aspect of the present invention.

Figure 1:
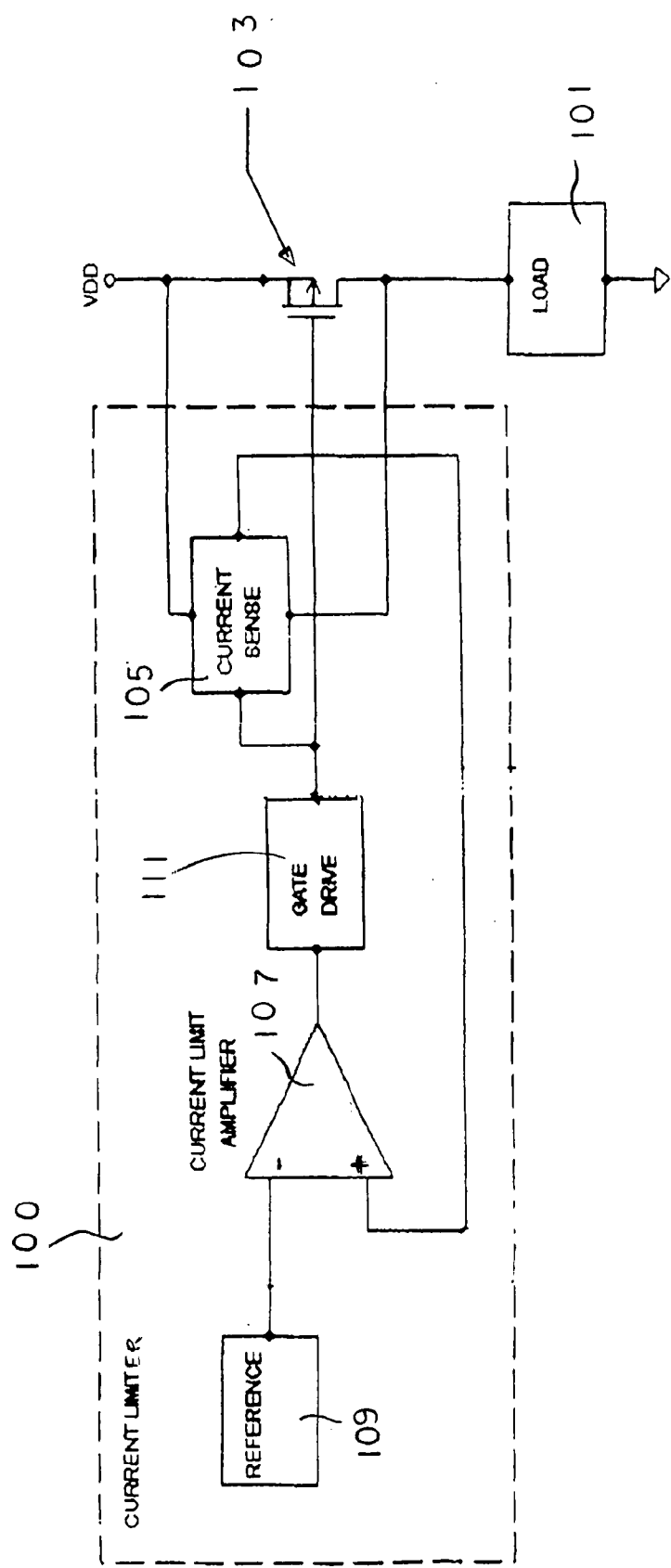
FIG. 1 (PRIOR ART) is a schematic block diagram for a current limit device for limiting the current into a load connected to a power source via a switch.

In FIG. 2, altered current limit circuitry 100A, or CURRENT LIMIT BLOCK ("CLB") 100A as it is referred to hereinafter, is a modified version of the CURRENT LIMITER 100 of FIG. 1. In accordance with this exemplary embodiment, the system 200 consists of a surge delay subsystem 201—referred to hereinafter as the SURGE DELAY BLOCK, or simply SDB, 201—interfaced with the CLB 100A. A basic aspect of the SDB 201 is to extend the current limit delay time of the CLB 100A by an appropriate SDT for allowing a temporary surge current to a given load, such as for a start-up routine.

The SDB 201 includes a CURRENT LIMIT COMPARATOR 203 and a SURGE DELAY circuit 205. The CURRENT LIMIT COMPARATOR 203 has one input 203A connected to the output of the REFERENCE circuit 109 and a second input 203B connected to the output of the CURRENT SENSE circuit 105. In other words, the CURRENT LIMIT COMPARATOR 203 of the SDB 201 has the same inputs as the altered CURRENT LIMIT AMPLIFIER 107A for receiving the threshold level from the reference circuit 109 and the CURRENT SENSE circuit 105 output of a signal indicative of real-time current through the switch 103 and thereby can recognize an over-current condition across the switch 103.

In operation, when an over-current condition with respect to the REFERENCE level is detected by the CLB 100A and the SDB 201, the SURGE DELAY circuit 205 is enabled. An enable signal is output after expiration of the SDT period by the SURGE DELAY circuit 205 via a connection 206 to an enable, "EN," input 207 of the CURRENT LIMIT AMPLIFIER 107A. In other words, compared with the known manner CURRENT LIMITER 100 of FIG. 1, the SDB 201 acts so that the current limit delay time designed into the CURRENT LIMITER 100A now is extended via the added delay time, SDT, required for the SDB 200 to react and enable the CURRENT LIMIT AMPLIFIER 107A, before allowing the standard current limit control loop to limit current through the switch 103 as described hereinabove. The current limit delay time may now be expressed as:

$$CLDT = CL_{RT} + SDB_{RT},$$

where $SDB_{RC}$ is the reaction time of the components making up the SURGE DELAY BLOCK 201.

Figure 3:
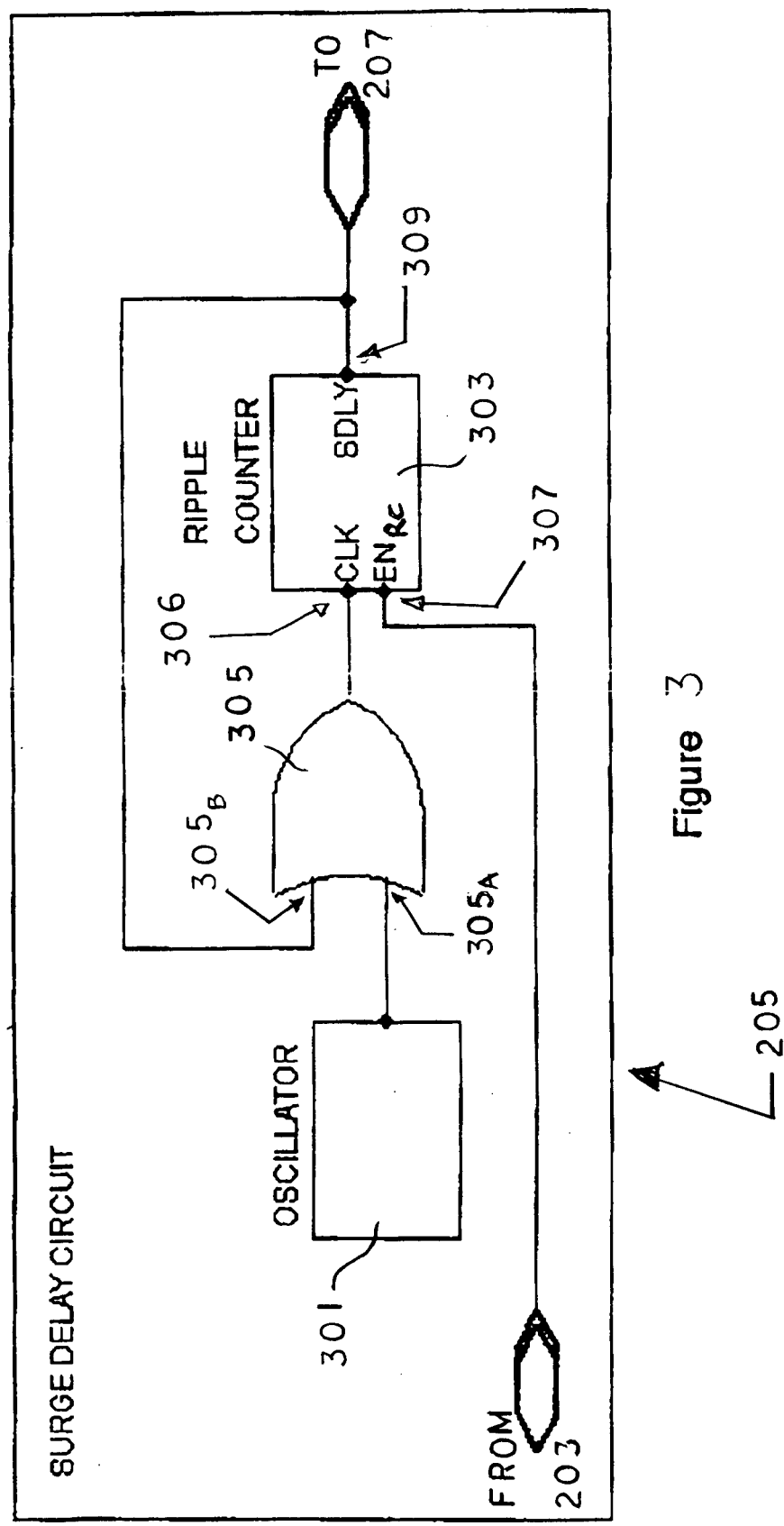
FIG. 3 is a schematic block diagram for an exemplary embodiment of a component of the present invention as shown in FIG. 2.

An exemplary embodiment implementation of a SURGE DELAY circuit 205 is shown in FIG. 3. Referring now to both FIGS. 2 and 3, an OSCILLATOR 301, having a predetermined frequency dependent upon the specific implementation design, is used to clock an n-stage RIPPLE COUNTER circuit 303 via an OR gate 305 having a first input 305A from the OSCILLATOR 301 and a second input 305B being a feedback signal from the RIPPLE COUNTER circuit 303. The RIPPLE COUNTER circuit 303 has a first input 306 for receiving the OSCILLATOR 301 clocking signal, "CLK," from the OR gate 305 output and a second input, "$EN_{RC}$" 307 for an enabling signal from the CURRENT LIMIT COMPARATOR 203. The output of the RIPPLE COUNTER circuit will provide the enable signal for the CURRENT LIMIT AMPLIFIER 107A EN input 207.

In operation, when input from the CURRENT LIMIT COMPARATOR 203 is LOW—indicative of a no over-current condition at the switch 103—the RIPPLE COUNTER enable input, $EN_{RC}$ 307 is LOW. In a known manner, each stage of the RIPPLE COUNTER 303 is reset when $EN_{RC}$ 307 is LOW. Therefore, the output of each stage of the RIPPLE COUNTER 303 is LOW until the next clock cycle signal, CLK, after the $EN_{RC}$ input 307 goes HIGH. That HIGH occurs when the SURGE DELAY CIRCUIT 205 is enabled by the CURRENT LIMIT COMPARATOR 203 determining a match indication between the signal output from the CURRENT SENSE 105 and REFERENCE 109 output that the current through the switch 103 has exceeded the reference threshold; in other words, there is an over-current condition at the switch 103. Now, the RIPPLE COUNTER 303 divides the given OSCILLATOR 301 frequency by, e.g., two for each stage. The output of the final stage of the n-stages switches to a HIGH half way through its cycle. This provides the RIPPLE COUNTER output 309 surge delay signal, "SDLY." The surge delay time, SDT, can be expressed as:

$$SDT = t_{SDLY} = t_{CLK} \times 2^{(n-1)},$$

where "$t_{CLK}$" is the time period established by the frequency of the OSCILLATOR 301 and "n" is the number of stages of the specific RIPPLE COUNTER 303 implementation. Thus, current limit delay time may now be expressed as:

$$CLDT = CL_{RT} + SDT.$$

The two input OR gate 305 will inhibit the clocking of the SURGE DELAY CIRCUIT 205 when the RIPPLE COUNTER circuit 303 output is HIGH. The RIPPLE COUNTER circuit 303 output 309 signal SDLY will remain HIGH until the SURGE DELAY CIRCUIT 205 is disabled by the CURRENT LIMIT COMPARATOR 203, namely when the CURRENT SENSE 105 detects current being drawn by the LOAD 101 through the switch 103 is below the REFERENCE 109 threshold level. Then, the RIPPLE COUNTER 303 is reset, forcing SDLY signal to be a LOW.

The SURGE DELAY CIRCUIT 205 design implementation may be governed by two operational constraints. Depending on the specific load appliance, the SURGE DELAY CIRCUIT 205 should provide a current limit delay time extension only in an approximate range of tens to hundreds of milliseconds before enabling the associated current limiter. The best time extension will depend on the given load. Secondly, the SURGE DELAY CIRCUIT 205 reset should be as fast as possible. It should be recognized that the present invention may be implemented in an integrated circuit, also referred to as a "die" or "chip." It will be recognized that the choice of implementation will also depend on such known requirements as the accuracy of the SDT required, the type of components available, the availability of input pins for the use of external components, and the like, with the common considerations of reducing die size and fabrication costs. For example, for a given surge delay time requirement design, a slower oscillator may result in fewer stages required for a ripple counter. However a slower oscillator typically requires larger components. Preferable minimization of the combined area for a single chip implementation for an oscillator and ripple counter may be used to determine the oscillator frequency and the number of stages required for a ripple counter and a given surge delay time requirement.

Figure 4:
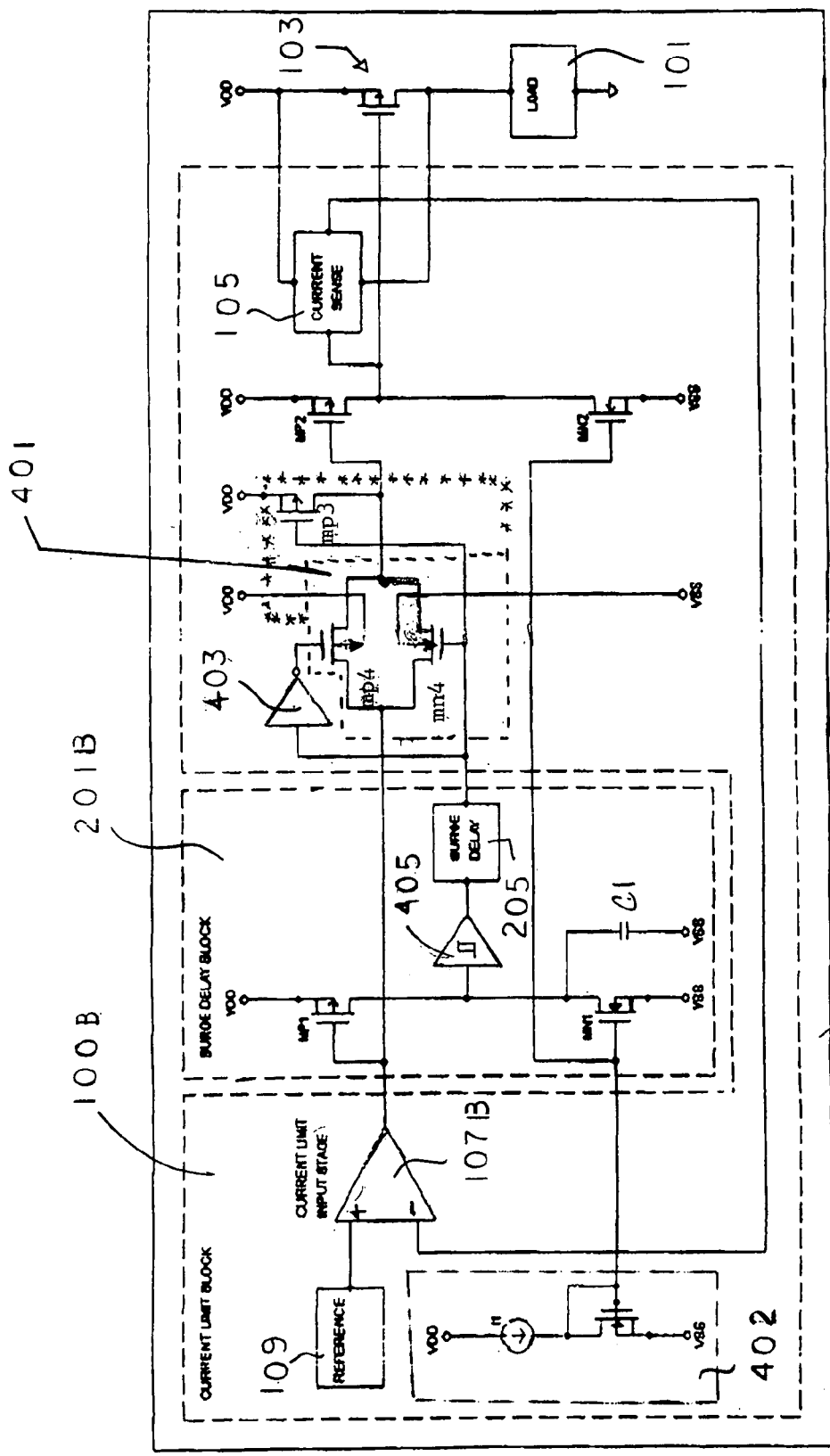
FIG. 4 is a schematic block diagram for another exemplary embodiment of the present invention.

FIG. 4 is another exemplary embodiment of the present invention. In this system 400 embodiment, there is shared a common input stage for a current limiter circuit and a surge delay circuit. For comparing the REFERENCE 109 output threshold signal to a real-time current value signal from the CURRENT SENSE circuit 105, a CURRENT LIMIT INPUT STAGE 107B and MOSFETs MP1 and MN1 form a comparator—analogous to COMPARATOR 203, FIG. 2. A current limit amplifier—analogous to FIG. 2, element CURRENT LIMIT AMPLIFIER 107A—is now formed by the combination of the CURRENT LIMIT INPUT STAGE 107B with MOSFETs MP2 and MN2 as an output stage, connected via an ANALOG SWITCH 401 formed by MOSFETs MP4, MN4, and an inverter 403 providing control logic. This use of a common CURRENT LIMIT INPUT STAGE 107B for the amplifier of the current limiter circuitry and the comparator of the surge delay circuitry removes any random offset voltage mismatch which may be inherent in using two independent input stages. Any random offset voltage mismatch between the output stages will also get divided by the gain of the input stage.

MOSFETs MN1 and MN2, as further described hereinafter, are driven as constant current sources in a known manner current mirror by bias circuit 402.

MOSFET MN1 being a current mirror of the bias circuit 402 provides a constant current, pulling the output of the CURRENT LIMIT INPUT STAGE 107B, MP1, MN1 to a LOW signal level during normal, steady-state, operation of the LOAD 101; namely, when there is no over-current condition at the switch 103. When the output of the CURRENT SENSE circuit 105 exceeds the REFERENCE 109 threshold level, indicative of an over-current condition at the switch 103, the CURRENT LIMIT INPUT STAGE 107B turns on MP1, over-driving MN1 and pulling the output of the comparator 107B, MP1, MN1 to a HIGH signal level, thus starting counting by the SURGE DELAY 205.

MOSFET MN2 being a current mirror of the bias circuit 402 provides a constant current pulling the output of the amplifier 107B, MP2, MN2 to a LOW signal level, turning the switch 103 fully ON during normal LOAD 101 operation. The SURGE DELAY 205 output is LOW during the normal LOAD 101 operation. Thus, this turns off the ANALOG SWITCH 401 connecting the output of the CURRENT LIMIT INPUT STAGE 107B to the gate of MOSFET MP2 and turns on a pull-up device MP3 that holds the gate of MOSFET MP2 HIGH, turning it OFF. "When the comparator 107B, MP1, SURGE DELAY BLOCK 201B MOSFET MN1 output goes HIGH —again, indicative of an over-current state in the switch 103 —the SURGE DELAY 205 is enabled, providing the SDT before the pull-up device MP3 is turned OFF and the ANALOG SWITCH 401 is turned ON." When the ANALOG SWITCH 401 is turned ON, the CLB 100B CURRENT LIMIT INPUT STAGE 107B drives MOSFET MP2 in opposition to MOSFET MN2, pulling up the gate of the switch 103 and placing the switch in a current limiting condition to protect the LOAD 101. Pull-up MOSFET MP3 is provided to ensure the gate of MOSFET MP2 is pulled to a HIGH, turned OFF, when the ANALOG SWITCH 401 is OFF.

In the embodiment of FIG. 4, a Schmitt Trigger buffer 405 is connected between the output of the comparator 107B, MP1, MN1 and the input of the SURGE DELAY circuit 205 to add hysteresis. This prevents a noisy current sense signal from propagating to the input of the SURGE DELAY circuit 205 for conditions where the current to the LOAD 101 is hovering near the REFERENCE 109 threshold level. Moreover, the Schmitt Trigger buffer 405 hysteresis prevents cycling into and out of current limiting conditions where random offset mismatch causes the current limit threshold of the comparator 107B, MP1, MN1 to be higher than the current limit threshold of the amplifier 107B, MP2, MN2. In such a situation, when the comparator 107B, MP1, MN1 detects an over-current condition and enables the amplifier 107B, MP2, MN2, the amplifier 107B, MP2, MN2 forces the current to the LOAD 101 below the threshold of the comparator 107B, MP1, MN1. Without hysteresis, the comparator 107B, MP1, MN1 turns OFF the current limiting. With the current limiting turned OFF, the current to the LOAD 101 may rise again above the comparator 107B, MP1, MN1 threshold, in which case the current limit is turned ON, and the cycle repeats. With sufficient design hysteresis, the drop in current to the LOAD 101 via switch 103 due to the enabling of the amplifier 107B, MP2, MN2 does not cause the comparator 107B, MP1, MN1 to turn OFF the current limiting and the cycling in and out of current limiting does not occur.

Another technique to avoid the current limit from cycling—namely, into and out of current limiting due to random offset mismatch that causes the current limit threshold of the comparator 107B, MP1, MN1 to be higher than the current limit threshold of the amplifier 107B, MP2, MN2—is to insert systematic offset into the comparator 107B, MP1, MN1. This systematic offset sets the current limit threshold of the comparator 107B, MP1, MN1 to be lower than that of the amplifier 107B, MP2, MN2 even with random offset mismatch. This systematic offset can be added by either scaling MP1 to MP2 or scaling MN1 to MN2 such that the output of the comparator 107B, MP1, MN1 switches at a lower level than the output of the amplifier 107B, MP2, MN2 as the output signal of the CURRENT SENSE 105 approaches the level of the output signal of REFERENCE 109, which indicates the initiation of an over-current state. The specific scaling factor for the devices will depend on the amount of systematic offset desired which will depend on the amount of random offset expected.

Adding systematic offset to the comparator 107B, MP1, MN1, by either scaling MP1 to MP2 or scaling MN1 to MN2, so that its current limit threshold is lower than that of the amplifier 107B, MP2, MN2 also allows the current limit circuitry to be enabled for lighter over-current loads. For a LOAD 101 that produces a light over-current event, the gate drive of the switch 103 needs to be decreased only a small amount such that the on-resistance of the switch 103 is increased only a small amount in order to current limit. This means that during current limiting for a light over-current case, the output level of the amplifier 107B, MP2, MN2, which drives the gate of the switch 103, only needs to increase by a small amount. However, the output level of the comparator 107B, MP1, MN1 needs to exceed the input threshold level of the Schmitt Trigger buffer 405 in order to enable the amplifier 107B, MP2, MN2. Adding systematic offset to the comparator 107B, MP1, MN1 can allow its output level to swing high enough to toggle the Schmitt Trigger buffer 405 for a light over-current load that requires only a small increase in the output level of the amplifier 107B, MP2, MN2 for current limiting.

In the preferred embodiment, a capacitor C1 in parallel with MOSFET MN1 is connected to the output of the comparator 107B, MP1, MN1. When the amplifier 107B, MP2, MN2 is enabled, there may be a transient drop in the current to the LOAD 101. Without the capacitor C1, this can cause a LOW pulse on the output of the comparator 107B, MP1, MN1, causing the current limiting to turn OFF. As the transient drop in the load current ends, the comparator 107B, MP1, MN1 again detects an over-current state. This enables the amplifier 107B, MP2, MN2, repeating the cycle. With the capacitor C1, the LOW pulse on the output of the comparator 107B, MP1, MN1 is filtered out and current limiting remains enabled.

In order to protect against true fault currents that can damage the LOAD 101 or the power switch 103, as opposed to legitimate surge currents, during the surge delay time SDT, a secondary current limit can be used in parallel with CURRENT LIMIT BLOCK 100A or CURRENT LIMIT BLOCK 100B. This secondary limit is of the form of CURRENT LIMITER 100 such that it has a fast current limit delay time consisting of only $CL_{RT}$. The secondary current limit has a current limit threshold set above the expected surge delay current level but below a level that will cause damage to the switch or the load.

Thus, the present invention provides a method and apparatus for a specified delay between the time an over-current condition to a load appliance is detected and the time when actual current limiting through a power distribution switch is implemented, allowing for conditions such as a start-up routine where a higher current transient may be needed. A benefit of this invention is that it allows for the power distribution switch to temporarily provide large currents, namely in excess of a predetermined reference threshold, over a controlled extended time period, yet maintaining a protection against a steady state operational condition over-current which may damage the load appliance. This invention thus circumvents start-up routine failures by allowing brief power surges to occur without sacrificing system safety should the power transient event actually be the onset of a fault or over-stress condition for the load.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A surge protection delay device for enabling a current limiter for a predetermined load, the device comprising:

means for determining a load over-current condition; and
driven by said means for determining, means for delaying activation of said current limiter by a time period approximately equal to a predetermined surge current characteristic of the load, wherein said means for determining further comprises: circuitry for comparing a reference threshold signal to a signal indicative of real-time electrical current to the load; said means for delaying activation further comprising circuitry for determining expiration of a time period between onset of a signal indicative of the load over-current condition and a predetermined delay time period and for sending a signal enabling said current limiter only after said expiration; and said means for delaying activation further comprises: an oscillator having a oscillator output for providing a clocking signal; an OR gate having a first OR gate input connected to said oscillator output and an OR gate second input and an OR gate output; and a ripple counter having a first ripple counter input connected to said OR gate output for receiving said clocking signal and a second ripple counter input for receiving a first enabling signal indicative of said over-current condition and a ripple counter output connected for sending a second enabling signal to said OR gate second input and to said current limiter.

2. The device as set forth in claim 1 wherein said means for delaying activation defines the time period as $t_{SDLY} = t_{CLK} \times 2^{(n-1)}$, where $t_{CLK}$ is the time defined by the frequency of the oscillator, and "n" is the number of stages of the ripple counter.

3. The device as set forth in claim 1 said means for determining further comprising:
a current limit comparator having a first input for receiving a reference signal indicative of a threshold current level defining said over-current condition and a second input for receiving a signal indicative of current being drawn by said load and an output for sending said first enabling signal when said reference signal and said signal indicative of current being drawn by said load are matching.

4. The device set forth in claim 3 further comprising:
the current limit comparator having a systematic input offset with reference to the current limiter such that an output of the current limit comparator enables the current limiter for a relatively light over-current condition to the load relative to a given steady-state current condition.

5. The device as set forth in claim 3 further comprising:
a capacitor connected to the output of the current limit comparator such that a transient drop in current level to said load during said over-current condition does not disable said current limiter.

6. The device as set forth in claim 1 further comprising:
in parallel with said current limiter, a secondary current limiter having a relatively fast current limit delay time compared to said current limiter and a current limit threshold set above an expected surge delay current level but below a level that will cause damage to the load.

7. The device as set forth in claim 1 further comprising:
means for hysteresis buffering between said means for determining and said means for delaying.

8. An electrical current surge protection system for a given load, the system comprising:
a current limiter circuit having a current limit delay time;
connected to said current limiter circuit, a surge delay circuit having a surge delay time, such that when said current limiter circuit detects a load over-current condition at said given load said surge delay circuit adds said surge delay time to said current limit delay time and delays enabling of said current limiter circuit, said surge delay circuit having circuitry for comparing a reference threshold signal to a signal indicative of real-time electrical current to the given load wherein a match is indicative of the load over-current condition, said circuitry for comparing requiring an enabling signal prior to providing a signal for limiting the electrical current to the given load and circuitry for determining expiration of a time period between onset of a signal indicative of the load over-current condition and a predetermined delay time period and for sending the enabling signal to the circuitry for comparing only after said expiration, and said circuitry for determining further comprises: an oscillator having a oscillator output for providing a clocking signal; an OR gate having a first OR gate input connected to said oscillator output and an OR gate second input and an OR gate output; and a ripple counter having a first ripple counter input connected to said OR gate output for receiving said clocking signal and a second ripple counter input for receiving a first enabling signal indicative of said over-current condition and a ripple counter output for sending a second enabling signal to said OR gate second input and to said current limiter.

9. The system as set forth in claim 8 said circuitry for comparing further comprising:
a current limit comparator having a first input for receiving a reference signal indicative of a threshold current level defining said over-current condition and a second input for receiving a signal indicative of current being drawn by said load and an output for sending said first enabling signal when said reference signal and said signal indicative of current being drawn by said load are matching.

10. The system as set forth in claim 8 wherein said circuitry for determining defines the predetermined delay time period as $t_{SDLY} = t_{CLK} \times 2^{(n-1)}$, where $t_{CLK}$ is the time defined by the frequency of the oscillator, and "n" is the number of stages of the ripple counter.

11. The system as set forth in claim 9 further comprising:
a capacitor connected to the output of the current limit comparator such that a transient drop in current level to said load during said over-current condition does not disable said current limiter.

12. The system set forth in claim 9 further comprising:
the current limit comparator having a systematic input offset with reference to the current limiter such that the output of the current limit comparator enables the current limiter for a relatively light over-current condition to the load relative to a given steady-state current condition.

13. The system as set forth in claim 8 further comprising:
in parallel with said current limiter, a secondary current limiter having a a relatively fast current limit delay time compared to said current limiter and a current limit threshold set above expected surge delay current level but below a level that will cause damage to the load.

14. The system as set forth in claim 8 further comprising:
a hysteresis buffer between said circuitry for determining and circuitry for comparing.

* * * * *